United States Patent [19]

Terada et al.

[11] Patent Number: 4,706,107
[45] Date of Patent: Nov. 10, 1987

[54] IC MEMORY CELLS WITH REDUCED ALPHA PARTICLE INFLUENCE

[75] Inventors: Kazuo Terada; Susumu Kurosawa; Shunichi Suzuki, all of Tokyo, Japan

[73] Assignee: Nippon Electric Co., Ltd., Japan

[21] Appl. No.: 830,919

[22] Filed: Feb. 20, 1986

Related U.S. Application Data

[63] Continuation of Ser. No. 385,321, Jun. 4, 1982, abandoned.

[30] Foreign Application Priority Data

| Jun. 4, 1981 | [JP] | Japan | 56-86208 |
| Jun. 4, 1981 | [JP] | Japan | 56-86209 |
| Jun. 4, 1981 | [JP] | Japan | 56-86210 |
| Jun. 4, 1981 | [JP] | Japan | 56-86213 |
| Jun. 4, 1981 | [JP] | Japan | 56-86214 |
| Jun. 4, 1981 | [JP] | Japan | 56-86215 |
| Jun. 4, 1981 | [JP] | Japan | 56-86216 |

[51] Int. Cl.⁴ .................................. H01L 29/78
[52] U.S. Cl. ........................ 357/23.5; 357/24; 357/14; 357/23.6; 357/42; 357/46; 357/23.11; 357/23.14; 365/150; 365/149; 365/184
[58] Field of Search ............... 357/23.5, 23.6, 42, 357/23.14, 23.11, 46, 14; 365/184, 149, 150

[56] References Cited

U.S. PATENT DOCUMENTS

| 3,648,128 | 3/1972 | Kobayashi | 357/42 X |
| 3,893,155 | 7/1975 | Ogive | 357/42 |
| 3,919,569 | 11/1975 | Gaensslen et al. | 357/24 X |
| 4,001,762 | 1/1977 | Aoki et al. | 357/23.6 X |
| 4,003,076 | 1/1977 | Polata et al. | 357/14 X |
| 4,081,818 | 3/1978 | Nakata | 357/38 X |
| 4,126,899 | 11/1978 | Lohstroh et al. | 365/184 X |
| 4,167,018 | 9/1979 | Ohra et al. | 357/56 X |
| 4,314,359 | 2/1982 | Kato et al. | 357/14 X |
| 4,384,300 | 5/1983 | Iizuka | 357/42 |
| 4,390,890 | 6/1983 | Bergeron et al. | 357/46 X |
| 4,395,723 | 7/1983 | Harari | 357/23.6 X |
| 4,429,326 | 1/1984 | Watanabe et al. | 357/23.5 X |
| 4,471,373 | 9/1984 | Shimizu et al. | 357/23.5 X |
| 4,480,319 | 10/1984 | Hoha et al. | 357/14 X |
| 4,489,341 | 12/1984 | Mayrand | 357/46 X |

FOREIGN PATENT DOCUMENTS 0149401 7/1985 European Pat. Off. ............ 365/149

OTHER PUBLICATIONS

Hu et al., "Oxide Wall Isolation for FET Integrated Circuits," *IBM Tech. Discl. Bull.*, vol. 25, No. 7A, Dec. 1982, pp. 3347-3349.

Barson, "Integrated Complementary Field-Effect and Bipolar Transistor Process," *IBM Tech. Discl. Bull.*, vol. 17, No. 1, pp. 86-87.

Magdo et al., "Complementary MOS Transistors," *IBM Tech. Discl. Bull.*, vol. 15, No. 6, Nov. 1972, pp. 1769-1770.

*Primary Examiner*—Andrew J. James
*Assistant Examiner*—William A. Mintel
*Attorney, Agent, or Firm*—Laff, Whitesel, Conte & Saret

[57] ABSTRACT

A semiconductor memory device has a semiconductor substrate with a first semiconductor region of one conductivity type in the substrate. A second semiconductor region of the opposite conductivity type is formed in the first semiconductor region. A third semiconductor region of the opposite conductivity type is arranged to be in contact with the first semiconductor region. A fourth semiconductor region of the one conductivity type is formed in the third semiconductor region. A fifth semiconductor region of the one conductivity type, within the semiconductor substrate, has a concentration which is higher than the impurity concentration of the first semiconductor region and is provided under the third semiconductor region. A continuous gate electrode is provided via a gate insulating layer formed on the surface of the first semiconductor region and on the surface of the third semiconductor region. The first, second and third semiconductor regions and the gate electrode form a first insulated-gate field effect transistor. The second, third and fourth semiconductor regions and the gate electrode serving as a second insulated-gate field effect transistor.

13 Claims, 22 Drawing Figures

IC MEMORY CELLS WITH REDUCED ALPHA PARTICLE INFLUENCE

This is a continuation of U.S. patent application Ser. No. 06/385,321, filed June 4, 1982, now abandoned.

BACKGROUND OF THE INVENTION

The present invention relates to a semiconductor integrated circuit device including memory cells, each cell having a pair of complementary insulated gate field effect transistors, and to a method for producing the device. More particularly, it relates to a semiconductor integrated circuit memory device with extremely small-sized memory cells, arranged in a high density.

U.S. Pat. No. 3,919,569 discloses a two-device, semiconductor memory cell constructed of a pair of complementary insulated gate field effect transistors (hereinafter abbreviated "IGFET's"). These transistors mutually share an impurity region that works as a source or a drain region of a first IGFET and also as a channel region of a second IGFET. In this two-device memory cell, P-type source and drain regions are formed in an N-type semiconductor substrate, in order to form a first IGFET. An N-type region is formed within one of the source and drain regions, which becomes a substrate region of a second IGFET. A continuous gate electrode is provided via a gate insulating film over the semiconductor substrate, between the source and drain regions of the first IGFET. The gate extends over either the source or drain, as the substrate region of the second IGFET, which uses the semiconductor substrate and the N-type region as a source and a drain, respectively. In this memory cell, the electric charges, which are stored in the substrate region of the second IGFET, are controlled by the first IGFET, in order to vary a threshold voltage of the second IGFET. Depending upon its threshold voltage, the second IGFET becomes either conductive or non-conductive in response to a constant voltage applied to its gate electrode.

The principal features of this prior art memory cell are that the memory cell, per se, can be a small size and that two kinds of currents having different magnitudes can be made to store information. The latter feature makes it possible to achieve a read-out of the memory by sensing a d.c. current. As a result, an output voltage applied to a sense amplifier can be made large enough, as long as a sufficient time is spent for the read-out. Hence, a sensitivity of the sense amplifier does not impose a limitation upon a high density integration of the memory circuit using this memory cell. Accordingly, this memory cell is well adapted for use in a high density formation and a large capacity formation of a semiconductor integrated circuit memory.

The semiconductor integrated circuit memory is packaged by a use of plastics or ceramics packaging materials. These packaging materials contain minute amounts of uranium, thorium, etc. Alpha particles generated from uranium, thorium, etc. travel straight through silicon, by about 25 $\mu$m. During that travel, about two million pairs of electrons and holes are produced. The depletion layer formed between one of the P-type source and drain regions is maintained in an electrically floating condition. The N-type region is formed in this depletion layer, and in the surrounding N-type semiconductor substrate. Accordingly, the produced pairs of electrons and holes move according to the electric field in the back-biased depletion layer. Holes move to the P-type region, while electrons move to the surrounding N-type semiconductor substrate, and afterward, all the electric charges stored in the floating P-type region (the substrate region of the second IGFET) are reduced.

Some other alpha particles penetrate through the depletion layer and come to the N-type semiconductor substrate, where the pairs of electrons and holes are produced and diffused as separated individually. These electrons and holes have a long life because a density of recombination centers is low there. Several tens of percents of the holes produced in the N-type semiconductor substrate may reach the above-mentioned depletion layer and then reach the floating P-type region, owing to an electric field applied across the depletion layer. Therefore, the amount of electric charges stored in the floating P-type region are further reduced. Such undesired effects by alpha particles should be eliminated.

The prior art two-device memory cell has another disadvantage in that the plan configuration of the memory cell, per se, is large, because one of the P-type source and drain regions of a first IGFET should be so large that the N-type region formed therewith can be isolated from the N-type semiconductor substrate. It may also be possible to reduce the memory cell size by bringing the sides of the larger one of the P-type source and drain regions and the N-type region therein into contact with a field insulating film buried in the substrate. With such a configuration, the larger P-type region extends under the field insulating film. Therefore, the field insulating film should be formed with a sufficient width in order that the adjacent memory cells may not influence each other. Accordingly, an overall size of the memory cell cannot be made very small.

SUMMARY OF THE INVENTION

One object of the present invention is to provide semiconductor integrated circuit memory devices comprising means for suppressing and reducing electric charges accumulated in a memory cell by alpha particle influence.

Another object of the present invention is to provide a semiconductor integrated circuit device having a two-device memory cell consisting of a pair of small sized complementary FET's.

According to one feature of the present invention, a semiconductor integrated circuit device comprises two-device memory cells, each having a first IGFET and a second IGFET. A first semiconductor region of one conductivity type is formed in said substrate, and a second semiconductor region of the opposite conductivity type is formed in said first semiconductor region. A third semiconductor region of the opposite conductivity type is formed adjacent to and in contact with the first semiconductor region. A fourth semiconductor region of the one conductivity type is formed in the third semiconductor region. A fifth semiconductor region of the one conductivity type has an impurity concentration which is higher than the concentration of the first semiconductor region and which is provided under the third semiconductor region. A gate insulating film may be provided continuously across the surface of the first semiconductor region and on the surface of the third semiconductor region. A gate electrode is formed on the gate insulating film. The first IGFET uses the first, second and third semiconductor regions as a channel region, a source region and a drain region, respectively. The second IGFET uses the first, third and fourth semiconductor regions as a source region, a channel region and a drain region, respectively.

The fifth semiconductor region may be formed as a buried layer within the semiconductor substrate and partially under only the third semiconductor region or wholly over the entire area of the semiconductor substrate. In the latter case, the fifth region is also positioned under the first semiconductor region. In one example, an epitaxial layer of the one conductivity type may be deposited entirely over the extended fifth region and employed as the first semiconductor region, and the second and third region may be formed in that epitaxial layer. In another example, an epitaxial layer of the opposite conductivity type, may be deposited entirely over the extended fifth region and the first semiconductor region may be formed in the epitaxial layer, to divide it into two separate portions which are employed as the second and third semiconductor regions.

In one preferred embodiment of the invention, a field insulating film is buried in the semiconductor substrate to extend inwardly from the major surface thereof and to reach the fifth semiconductor region, abutting against the third and fourth semiconductor region. In this case, two, two-device memory cells may adjoin each other with the field insulating film placed therebetween. Furthermore, it is favorable for boron to be used as the impurity in the second and third regions of the opposite conductivity type. The impurity concentration in the third region of the opposite conductivity type is chosen such that it may take a maximum value at a depth of about 0.3 to 0.4 $\mu$m from the principal surface. A two-device memory cell can have a large read-out current and a large threshold voltage difference.

According to the present invention, the highly-doped fifth semiconductor region is located under the third semiconductor region, which works as a floating substrate region of the second IGFET. Therefore, it contributes to reduce the width of the depletion layer of a P-N junction of the third semiconductor region. If the depletion layer is made thinner, there is a reduction in the number of hole-electron pairs produced by alpha particles in the depletion layer which suppresses the reduction of electric changes in the third semiconductor region. The highly-doped fifth region further prevents movement of the charges of the hole-electron pairs, which are generated by alpha particles, from the semiconductor substrate into the depletion layer of the third region. Moreover, since less hole-electron pairs are produced in a highly-doped region, there are less chances for generating the hole-electron pairs by alpha particles near the depletion layer of the third region, where the highly-doped fifth region is located. In conclusion, the fifth region according to the invention can suppress the influence of the alpha particles.

DETAILED DESCRIPTION OF THE PREFERRED EMBODIMENTS

Figure 1:
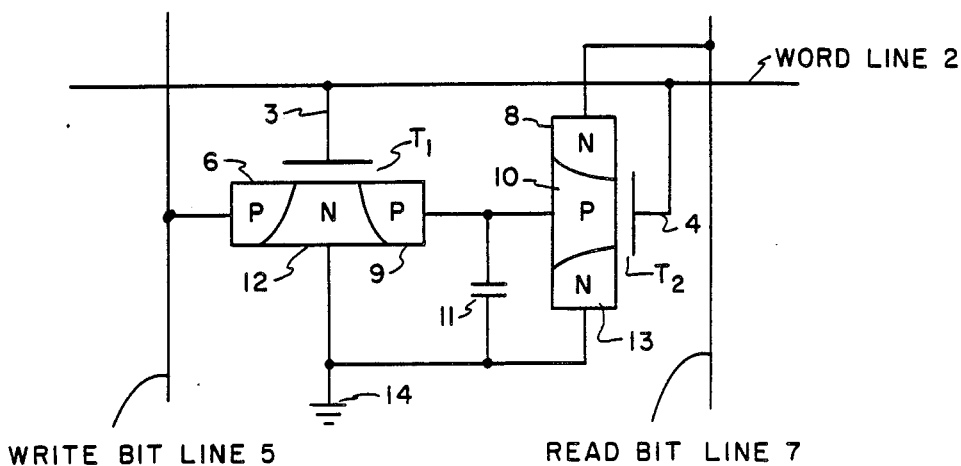
FIG. 1 is a circuit diagram of a two-device memory cell constructed in such a manner that a first IGFET achieves a storage of electric charges and a second IGFET changes its threshold value depending upon the electric charge.

FIG. 1 is a circuit diagram of a two-device memory cell. In FIG. 1, a first IGFET $T_1$ is constructed of an N-type region 12 having a channel formed along its surface, P-type regions 6 and 9 serving as source and drain regions, respectively, and a gate electrode 3. A second IGFET $T_2$ is constructed of a P-type region 10 having a channel formed along its surface, N-type regions 8 and 13 serving as source and drain regions, respectively, and a gate electrode 4. The P-type region 6 of the first transistor $T_1$ is connected to a write bit line 5, the gate electrode 3 is connected to a word line 2, and the P-type region 9 is connected to the P-type region 10 of the second transistor $T_2$. The N-type region 8 of the second transistor $T_2$ is connected to a read bit line 7, and the gate electrode 4 is connected to the word line 2. The N-type region 12 of the first transistor $T_1$ and the N-type region 13 of the second transistor $T_2$ are connected to the ground 14. In addition, a capacitor 11 is connected between the P-type region 10 and the N-type region 13 of the second transistor $T_2$.

Figure 2:
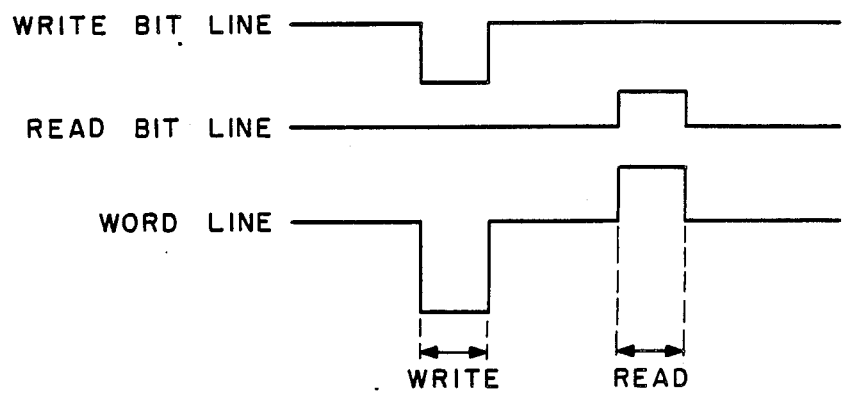
FIG. 2 shows voltage waveforms appearing at various portions in the circuit shown in FIG. 1, upon writing and reading.

In the two-device memory cell illustrated in FIG. 1, read and write of the memory cell are effected by applying voltage waveforms as shown in FIG. 2. At first, upon writing, a negative voltage is applied to the word line 2. In response to this negative voltage, the first transistor $T_1$ switches ON. At this moment, the second transistor $T_2$ is held OFF because it is an N-channel type. Then, to the write bit line 5 is applied either a negative voltage corresponding to the "1" state or a ground voltage corresponding to the "0" state. Depending upon this applied voltage, an electric charge is stored on the capacitor 11. The stored electric charge determines the substrate potential of the second transistor $T_2$. Subsequently, upon reading, to the word line 2 is applied a positive voltage having a magnitude such that when the substrate potential of the second transistor $T_2$ is held negative with a negative charge stored in the capacitor 11. The second transistor $T_2$ may now be turned ON. However, when the substrate potential of the second transistor $T_2$ is grounded, with no electric charge stored in the capacitor 11, the second transistor $T_2$ may be held OFF, while an appropriate positive voltage is being applied to the read bit line 7. It is possible to detect whether the second transistor $T_2$ is conducting or non-conducting.

Figure 3:
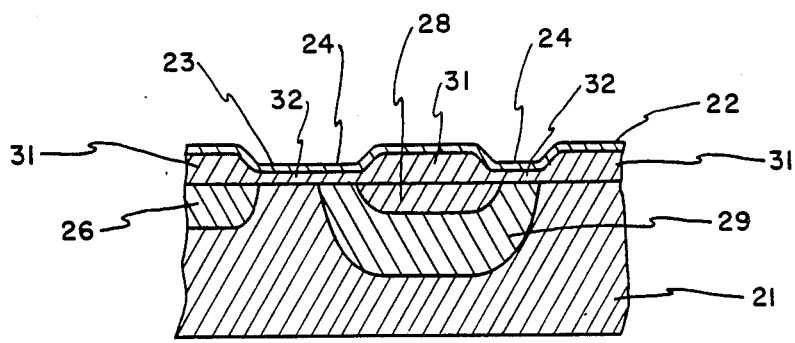
FIG. 3 is a cross sectional view of a two-element memory cell in the prior art which realizes the circuit shown in FIG. 1.

FIG. 3 illustrates a known prior art semiconductor structure for making the two-device memory cell shown by the circuit diagram in FIG. 1. In the memory cell shown in FIG. 3, a P-type region 26 serves as a drain of the first transistor $T_1$ and a P-type region 29 serves as a source of the first transistor $T_1$ and a channel region of the second transistor $T_2$. These elements are constructed on a major surface of an N-type substrate 21. Furthermore, an N-type region 28 is formed within the P-type region 29.

On the major surface of the substrate 21 are formed an insulating film 31 and a gate insulating film 32 at the portions of gate regions 23 and 24. On these insulating films is provided a wiring layer 22. A part of this wiring layer 22 forms a gate electrode. The transistor $T_2$ is a P-channel field effect transistor using the N-type substrate 21 as a source and the N-type region 28 as a drain. The capacitor 11 is formed by a PN-junction capacitance between the N-type substrate 21 and the P-type region 29. In the prior art, it is difficult to reduce the size of this two-device memory cell because the channel region of the second transistor is formed on both sides of the N-type region 28. Moreover, when integrating a plurality of such two-device memory cells, a parasitic channel would be formed between adjacent devices and, hence, an undesired interaction would occur between these adjacent cells.

Figure 4:
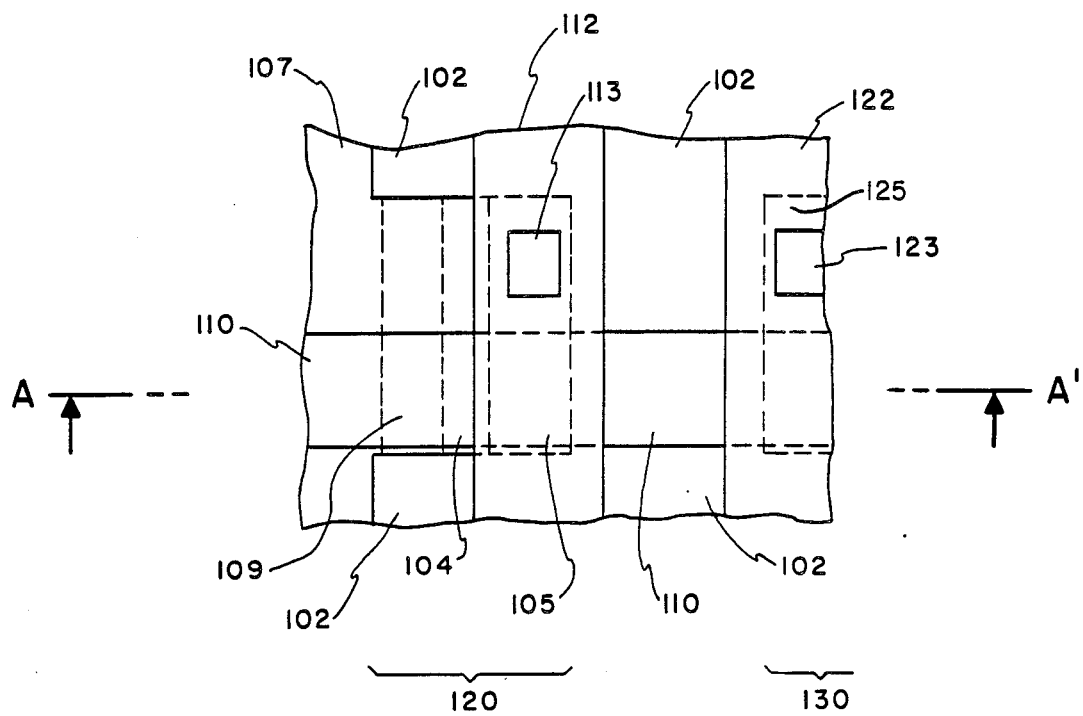
FIG. 4 is a partial plan view of a semiconductor integrated circuit device constructed in such a manner that the other two memory cells in the prior art are made to adjoin each other.
Figure 5:
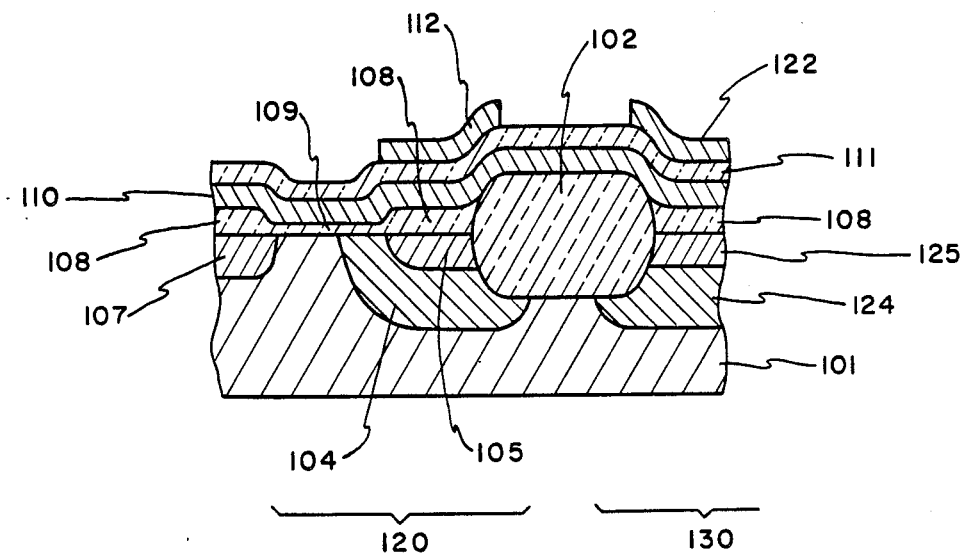
FIG. 5 is a cross sectional view of the semiconductor integrated circuit device shown in FIG. 4, taken along line A-A' in FIG. 4, as viewed in the direction of the arrows.

Therefore, as shown in plan and in cross section in FIGS. 4 and 5, respectively, a high-density integration of such two-device memory cells is accomplished by forming an isolation between two devices 120 and 130, with a field insulating film 102 buried in a substrate, for providing a second P-type region which makes contact with this field insulating film 102 in order to reduce its size to one-half of the size of the second P-type region in the prior art structure.

In the memory cells illustrated in FIGS. 4 and 5, there is a field insulating film 102 buried in an N-type substrate 101. This field insulating film 102 isolates a second P-type region 104 from a second P-type region 124 of an adjacent memory cell. In addition, within the second P-type region 104 is an N-type region 105 which is in contact with the field insulating film 102. Within the N-type substrate 101 is a first P-type region 107, as opposed to the second P-type region 104. An insulating layer 108 is provided on the first P-type region 107 and on the N-type region 105 within the second P-type region 104. A gate insulating film 109 is formed on th N-type substate 101 and on the second P-type region 104. A first wiring layer 110 extends over the insulating layer 108 and the field insulating film 108, thus forming a gate electrode on the gate insulating film 109. On the above-mentioned structure are provided second wiring layers 112 and 122, via an inter-layer insulating layer 111. The second wiring layers 112 and 122 are connected to the N-type regions 105 and 125 through contact holes 113 and 123 formed in the insulating layer 108.

However, even with such a construction, if the width of the field insulating film 102 is narrowed and the adjacent devices 120 and 130 are brought close to each other, an undesired interaction, caused by a parasitic channel, would occur. Moreover, since the P-type region 104 requires a certain depth, such as, for example, from 2 to 3 µm, or more, this P-type region 104 is formed as extending to the underside of the field insulating film 102. Accordingly, it was necessary to expand the interval between the adjacent devices 120 and 130 to a certain extent. As described in the foregoing, no means has been provided to prevent the influence of alpha particles which reduces electric charges stored in the floating regions 29 (FIG. 3), 104 (FIGS. 4, 5).

Now, a description will be made of a first preferred embodiment of the present invention.

Figure 6:
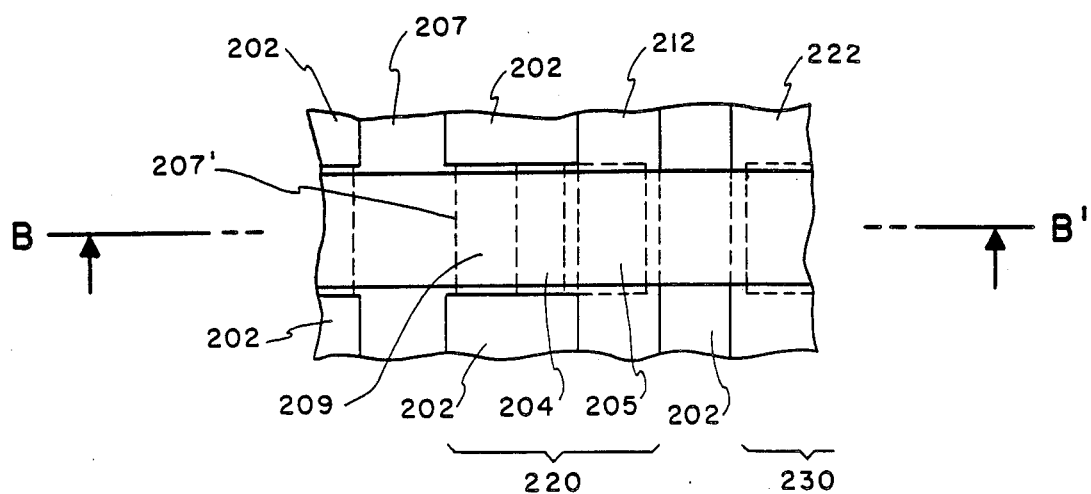
FIG. 6 is a partial plan view of a first preferred embodiment of the semiconductor integrated circuit device according to the present invention.
Figure 7:
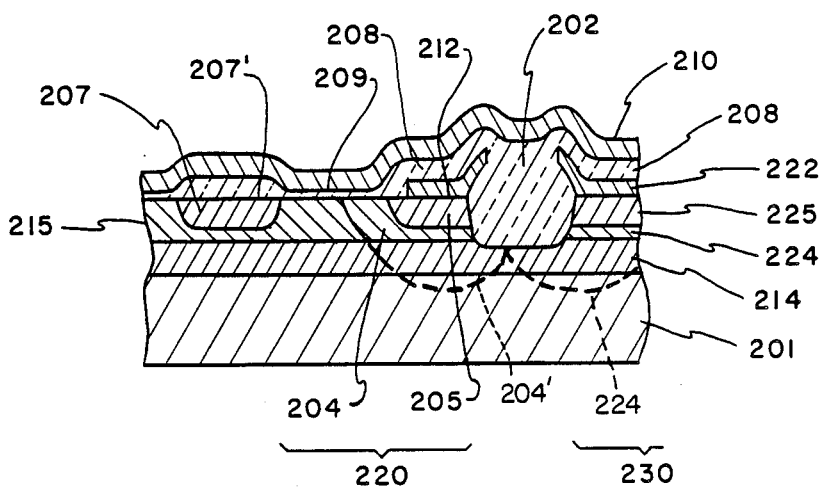
FIG. 7 is a cross sectional view of the semiconductor integrated circuit device shown in FIG. 6, taken along line B-B' in FIG. 6, as viewed in the direction of the arrows.

FIG. 6 is a partial plan view of a semiconductor integrated circuit device according to a first preferred embodiment of the present invention, and FIG. 7 is a cross sectional view of the same circuit taken along line B–B' in FIG. 6 (as viewed in the direction of the arrows).

With reference to FIGS. 6 and 7, an N-type semiconductor substrate 201 has a high specific resistivity of 20 Ω·cm. A first semiconductor layer 214 of N+-type having a low resistance of 0.01 Ω·cm and a thickness of 1 µm is formed on the top of substrate 201. On the first semiconductor layer 214 is formed a second and N-type semiconductor layer 215, having a specific resistance of 2 Ω·cm and a thickness of 2 µm.

In this second semiconductor layer 215, an elongated region 207 is diffused, which serves as a write bit line in a memory matrix. A first P-type region 207' continues to the diffused region 207 and a second P-type region 204 are provided in each memory cell region 220, 230. Within the second P-type region 204, an N-type region 205 is formed. This second P-type region 204 is formed in the second semiconductor layer 215, with its bottom contacting the first semiconductor layer 214 and having a low resistivity. The side edges of region 204 contact a field insulating film 202 that is formed to isolate the memory cell regions 220 and 230, in areas which are 6 µm×11 µm each. Numeral 222 denotes another read bit line for the subsequent memory cell 230.

On the right side (as viewed in FIG. 7) of the field insulating film 202, to which the memory cell 220 makes contact, is positioned a second P-type region 224 of an adjacent memory cell 230, with its side edges contacting the field insulating film 202. Further, an N-type region 225 is provided within the P-type region 224. Still further, a first wiring layer 212, which consists of polycrystalline silicon, is provided on the N-type region 205 and the field insulating film 202. An insulating layer 208 is provided on the first wiring layer 212 and the field insulating film 202. A gate insulating film 209 is provided on the second semiconductor layer 215 and the second P-type region 204. A second wiring layer 210 of polycrystalline silicon forms a gate electrode on the gate insulating film 209 and extends over the insulating film 208. The first wiring layer 212 is connected to the N-type region 205 at almost all of the surface of the N-type region 205. In this way, a first transistor $T_1$ uses the first P-type region 207' and the second P-type region 204 as a source and a drain, respectively. Its channel is formed in the second semiconductor layer 215 between the first P-type region 207' and the P-type region 204. A second transistor $T_2$ uses the second semiconductor layer 215 and the N-type region 205 as a source and a drain, respectively. Its channel is formed in the second P-type region 204.

With the above-described semiconductor structure, each second P-type region 204, 224 has its depth limited up to the boundary surface between the second semiconductor layer 215 and the first semiconductor layer 214, of an N+-type, having a low resistance. There is no fear that either second P-type region 204, 224 may be formed, as extended under the field insulating film 202. In other words, it cannot take the configuration indicated by phantom lines 204', 224' in FIG. 7. Moreover, since the field insulating film 202 makes contact with the first semiconductor layer 214 of an N+-type having a low resistance and buried therein, generation of an undesired parasitic channel can also be prevented. As a result, the second P-type region 204 has a depth and a surface impurity concentration, respectively, which can be preset independently of each other.

In the memory cell according to the illustrated embodiment of the present invention, the second P-type region 204 has its surface impurity concentration preset at $10^{15}$ to $10^{17}$ cm$^{-3}$ and its depth, that is, the thickness of the second semiconductor layer preset at 2 $\mu$m. Accordingly, the necessary width of the field insulating film 202 in the illustrated embodiment of FIG. 7 is 2 $\mu$m, in contrast to the necessary width of the field insulating film 102 of 4 $\mu$m in the known semiconductor integrated circuit arrangement in the prior art shown in FIGS. 4 and 5. No contact holes are required to be formed in an insulating film in this embodiment. The first wiring layer 212 is connected with almost all the surface of the N-type region 205. The N-type region 205 can be formed by impurity diffusion from the first wiring layer 212 of the N-type polycrystalline silicon layer 205.

In operation of the memory cell according to the illustrated embodiment, a positive voltage, such as, for example, +2 V is applied to the N-type semiconductor substrate 201. The first wiring layer 210 is used as a word line which is energized with +2 V upon reading, −3 V upon writing, or 0 V during the other period. The first P-type region 207' is used as connected to the write bit line 207 and is energized with 0 V upon writing "0" or −3 V upon writing "1". And, upon reading, a voltage of either 0 V or approximately 1 V is generated on the second wiring layer 212 which is used as a read bit line 212, as a result of an electric charge which is stored in the second P-type region 204 during a writing step. As described above, +2 V is applied to the substrate 201. Then, when +2 V is applied to the word line, the PN-junction between second P-type region 204 and the N-type semiconductor substrate 201 is not forwardly biased. This is true even though the potential at the second P-type region 204 rises due to a capacitive coupling formed via the portion of the gate insulating film 209 on the second P-type region 204. Hence, the memory cell can operate stably.

Here, it is to be noted that most of the capacitance formed around the second P-type region 204 (denoted by $C_{ST}$) consists of a junction capacitance between the second P-type region 204 and the first and second semiconductor layers 214 and 215 (denoted by $C_B$) A junction capacitance between the second P-type region 204 and the N-type region 205 (denoted by $C_R$), and the above-mentioned MOS capacitance formed via the gate insulating film 209 (denoted by $C_A$). That is, the following relationship is fulfilled:

$$C_{ST}=C_A+C_B+C_R .$$

In this equation, it is desirable to make the capacitance $C_{ST}$ as large as possible. The potential at the second P-type region 204 is varied depending upon the voltage applied to the word line 210. This is due to the influence of the capacitance $C_A$. In the illustrated embodiment, since the voltage change on the word line 210 is 5 V, the potential at the second P-type region 204 would change by 5 $C_A/C_{ST}^V$. Accordingly, if the ratio $C_A/C_{ST}$ becomes 0.14, or larger, then the voltage change becomes 0.7 V, or higher, and the potential at the second P-type region 204, upon a change to "0"-state, tends to rise to 0.7 V, or higher. However, since the PN-junction between the N-type region 205 and the second P-type region 204 is forwardly biased, the electric charge would flow out to the read bit line 212 after the second P-type region 204 is clamped at 0.7 V upon "0"-state.

On the other hand, upon reaching the "1"-state, owing to application of −3 V to the write bit line, the second P-type region 204 would take a potential of about −1.5 V, but actually it would become −0.8 V, or higher, due to the above-mentioned potential rise of 0.7 V, or higher. Accordingly, the potential difference, at the second P-type region 204 would be reduced between the "0"-state and the "1"-state of the memory cell. Therefore, it is necessary to make the ratio $C_A/C_{ST}$ smaller than $0.7/V_w$, where $V_w$ represents a width of change of the voltage applied to the word line 210.

On the other hand, the read out of the "1"-state is to detect an appearance on the read bit line 212 of the positive voltage applied to the N-type semiconductor substrate 201. However, when a positive voltage appears on the read bit line 212, the back-bias voltage between the second P-type region 204 and the N-type region 205 becomes higher. Hence, the threshold value of the second transistor rises, so that even if +2 V is applied to the N-type semiconductor substrate, only a voltage of approximately +0.5 V would appear at the N-type region 205. Therefore, by making the ratio $C_R/C_{ST}$ large, the voltage rise at the N-type region 204 is positively fed back to the second P-type region 204.

However, it is not true that better results are obtained by making the ratio $C_R/C_{ST}$ closer to "1". Since the memory cells are arranged in a matrix shape to form a memory array, both the memory cell to be read out and the other memory cells, connected to the unselected word lines (applied with 0 V), are connected to the read bit line. The capacitances $C_{ST}$ of the second P-type regions in these unselected memory cells are also subjected to a feedback caused by the voltage rise on read bit line 212. Representing an increment of the voltage on the read bit line 212 by $\Delta V_R$, the amount of feedback would be $\Delta V_R \cdot C_R/C_{ST}$. Accordingly, if the voltage applied to the word line 210 upon writing is represented by $V_A$, the potential at the capacitance in a "0"-storage state in the unselected memory cell rises to $(V_A C_A + \Delta V_R C_R)/C_{ST}$. Even if this potential should exceed 0.7 V, the PN-junction would not become forwardly biased, because the potential at the surrounding P-type region has been also raised. However, if the potential at the capacitance $C_{ST}$ in a "1"-storage state exceeds 1 V, then the first transistor becomes conducting and, hence, the "0"-storage potential approaches to the "1"-storage potential. Accordingly, the capacitance ratio $C_R/C_{ST}$ has an upper limit, as follows:

$$C_R/C_{ST} < |V_{TP}|/\Delta V_R$$

where $V_{TP}$ represents a threshold value of the first transistor.

In the illustrated embodiment of the present invention, the capacitance $C_B$ is made larger by constructing the second P-type region 204 to make contact with the first semiconductor layer 214 of N-type having a low resistance. Furthermore, the capacitance $C_R$ is made larger by increasing the concentration in the portion of the second P-type region 204 near to the N-type region 205, and thereby, the above-described problem is dealt with.

Figure 8:
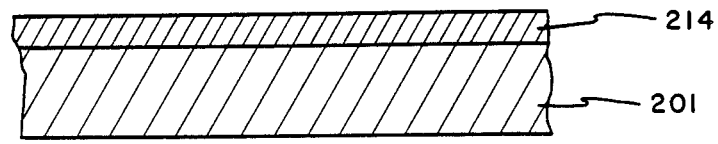
FIGS. 8–12 are cross sectional views illustrating the successive steps in the method for manufacturing the semiconductor integrated circuit device according to the first preferred embodiment.
Figure 9:
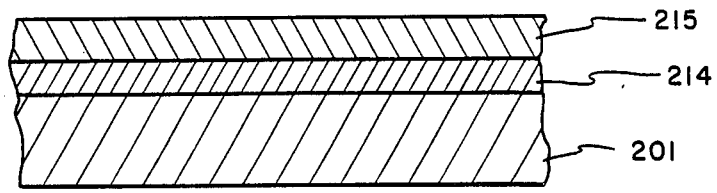
Figure 10:
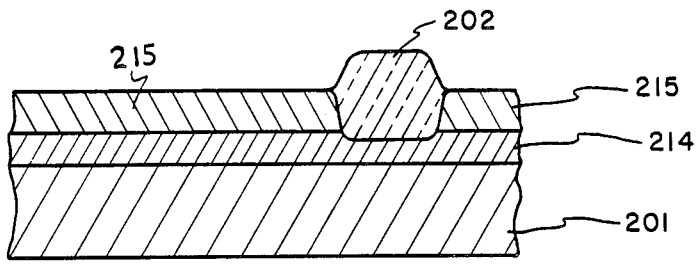
Figure 11:
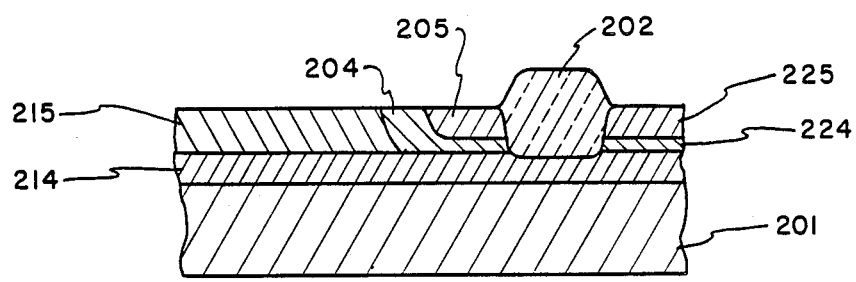
Figure 12:
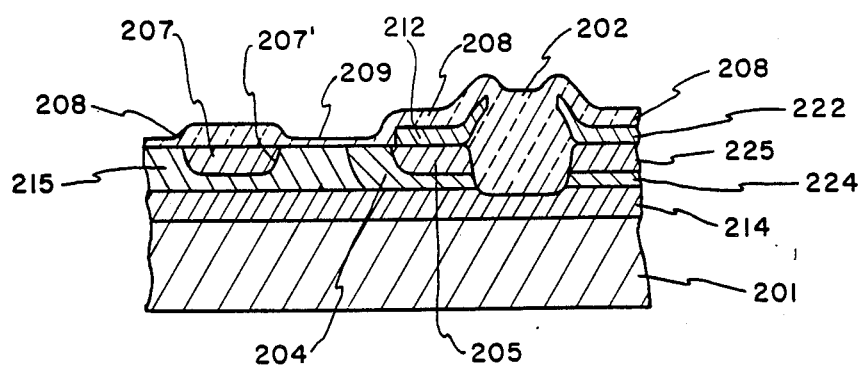

Now, a method for manufacturing the above-described semiconductor integrated circuit device, according to the first preferred embodiment of the present invention, will be described with reference to FIGS. 8 through 12. At first, as shown in FIG. 8, a first semiconductor layer 214 of N+-type has a low resistance with a specific resistivity of 0.01 Ω. cm and is formed on an N-type silicon crystal substrate 201, having a specific resistivity of 20 Ω. cm. Layer 214 is an epitaxial crystal film of 0.5 μm thickness. Subsequently, as shown in FIG. 9, a second semiconductor layer 215 of N-type with a specific resistance of 2 Ω. cm is formed by means of an epitaxial crystal film of 2 μm thickness. Next, as shown in FIG. 10, a field insulating film 202 of silicon dioxide serves as an isolation region and is formed in the second semiconductor layer 215 to reach the first semiconductor layer 214, and become buried therein, through a use of the conventional technique of selective oxidation. Thereafter, a second P-type region 204 and an N-type region 205 are provided by an ion implantation or a thermal diffusion process, as shown in FIG. 11. Further, a first P-type region 207', a diffused wiring 207, a first wiring layer 212 consisting of N-type polycrystalline silicon, an insulating film 208, and a gate insulating film 209 are provided, as shown in FIG. 12. Then, by forming a second wiring layer 210 (FIG. 7), which consist of polycrystalline silicon, a basic structure of a two-memory cell can be obtained as described previously and illustrated in FIGS. 6 and 7.

In the method for manufacture according to the above-described embodiment of the present invention, it is necessary to make the impurity concentration in the first semiconductor layer 214 of N+-type with a low resistance which is at least higher than that in the external portion of the second P-type region 204 which has penetrated through the second semiconductor layer 215 of N-type and has reached the first semiconductor layer 214 of N+-type having a low resistance. Owing to such a provision, in addition to preventing a generation of a parasitic channel, the effect of the P-type impurity spreading under the field insulating film 202 from region 204 can be prevented. The adjacent P-type regions 204 can be insulated from each other by means of a narrow device 202 isolation region between the adjacent regions 204 and 224.

In addition, in the illustrated embodiment, the first semiconductor layer 214, of N+-type and having a low resistance, has an impurity concentration that is more than 1000 times as high as that in the surrounding N-type region. As long as this first semiconductor layer 214 exists, it is almost impossible for the holes produced in the N-type semiconductor substrate 201 by alpha particles to go over the potential barrier of this first semiconductor layer 214.

Also, the thickness of the depletion layer formed at the boundary between the second P-type region 204 and the first semiconductor layer 214 is sufficiently thin, because the thickness is inversely proportional to a square root of an impurity concentration. Hence, the alpha particles have a short travelling range in the depletion layer, and thus, the number of produced electron-hole pairs is reduced. Accordingly, by providing the second P-type region 204 and the first semiconductor layer 214 of N+-type having a low resistance, the hindrance caused by alpha particles can be greatly mitigated. Besides, owing to the reduction in thickness of the depletion layer, the depletion layer capacitance of the second P-type region is increased in an electrically floating condition. Thus, the quantity of stored electric charge can be increased.

Now, a description will be made of a second preferred embodiment of the present invention. A semiconductor integrated circuit arrangement according to a second preferred embodiment of the present invention is partly illustrated in plan in FIG. 13 and in a cross sectional view thereof (FIG. 14) taken along line C-C' in FIG. 13, as viewed in the direction of the arrows.

Figure 13:
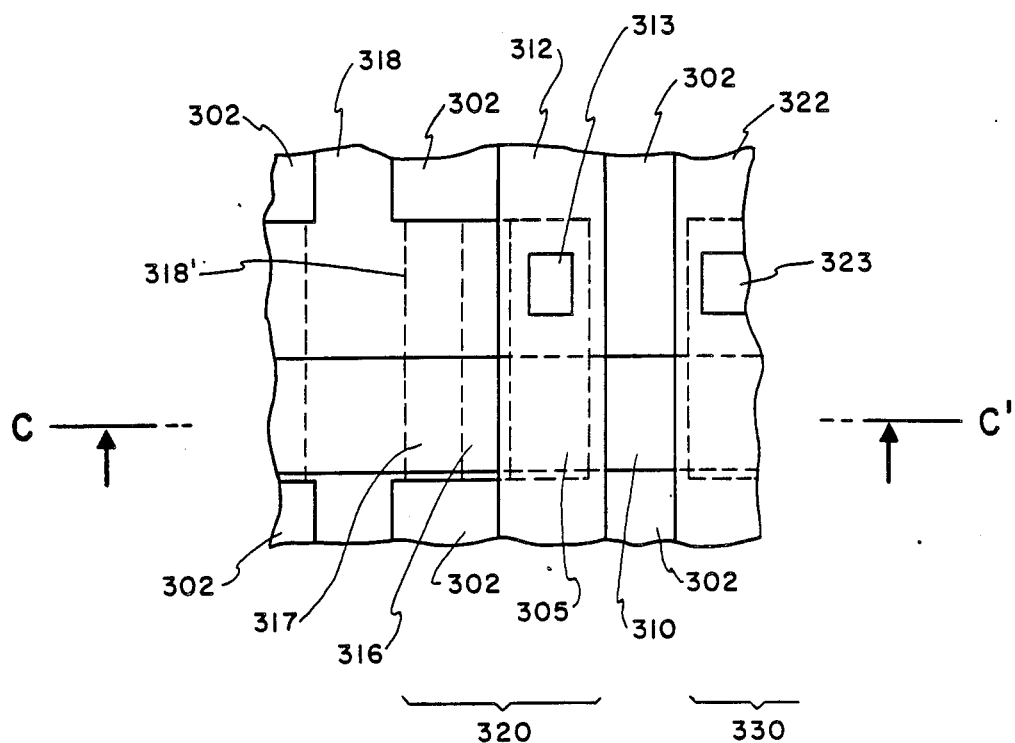
FIG. 13 is a partial plan view of a second preferred embodiment of the semiconductor integrated circuit device according to the present invention.
Figure 14:
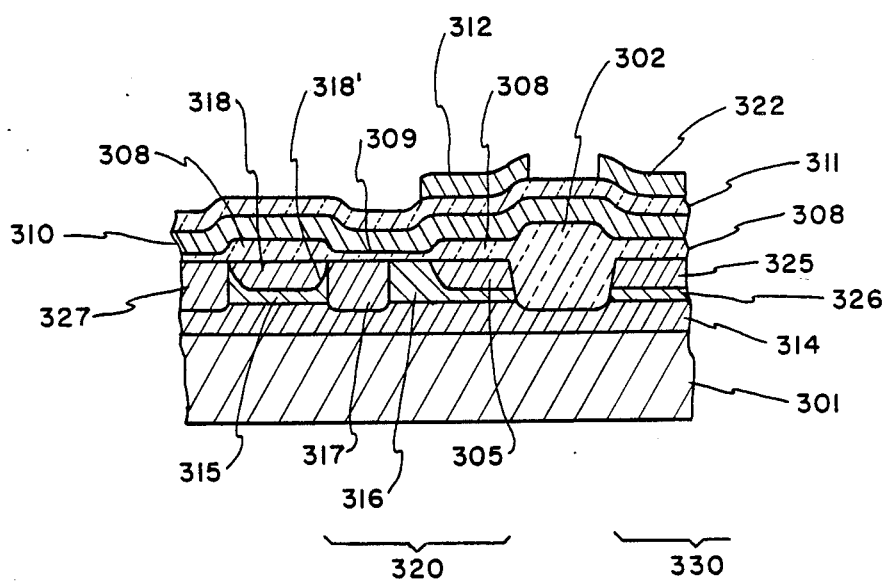
FIG. 14 is a cross sectional view of the semiconductor integrated circuit device shown in FIG. 13, taken along line C-C' in FIG. 13, as viewed in the direction of the arrows.

In FIGS. 13 and 14, a first semiconductor layer 314 of N+-type has a low resistance with a specific resistance of 0.01 Ω·cm and a thickness of 1 μm layer 314 is formed on a high resistance N-type semiconductor substrate 301, having a specific resistance of 20 Ω·cm. Furthermore, a P-type semiconductor layer 326 has a specific resistance of 2 Ω·cm and a thickness of 2 μm. In this P-type semiconductor layer is provided a first N-type region 317 having a high resistance with a specific resistance of 2 Ω·cm which reaches the first semiconductor layer 314 of N+-type region 317 has a low resistance to divide the P-type semiconductor layer into a first P-type region 315 and a second P-type region 316.

In addition, there is a field insulating film 302 in contact with the second P-type region 316. A second N-type region 305 is provided within the second P-type region 316 and in contact with the field insulating film 302. Also, in the first P-type region 315 are provided a diffused wiring 318 and a low-resistance P-type portion 318. Memory cell 320 is on the left side (as viewed in FIG. 14) of the field insulating film 302. A second P-type region 326 of the adjacent memory cell 330, with the side edges of region 326 contacting the right side of field insulating film 302, and furthermore, within the P-type region 326 is an N-type region 325. An insulating layer 308 is provided on the first P-type region 315 and on the second N-type region 305. A gate insulating film 309 is formed on the first N-type region 317 and on the second P-type region 316. Further, a first wiring layer 310 forms a gate electrode on the gate insulating film 309 and extends over the insulating layer 308 and the field insulating film 302. A second wiring layer 312 is provided thereon via an inter-layer insulating layer 311. The reference numeral 322 identifies another second wiring corresponding to 312 for another memory cell 330. The reference numeral 327 indicateds a region which is equivalent to the region 317, but is for a memory in the left side (not shown). The second wiring layer 312 is connected to the second N-type region 305, through an aperture formed in the insulating film 308.

With the above-described structure also, the depth and the impurity concentration of the second P-type region 316 can be preset independently of each other, which is similar to the first preferred embodiment of the present invention. Moreover, generation of an undesired parasitic channel can be perfectly prevented by means of the first semiconductor layer of N+-type, having a low resistance. It is to be noted that in this second preferred embodiment, the width of the field insulating film 302 becomes 2 μm, which is identical to the corresponding width in the first preferred embodiment. In operation, the voltages applied to the various portions are the same as the voltages employed in the first preferred embodiment.

Figure 15:
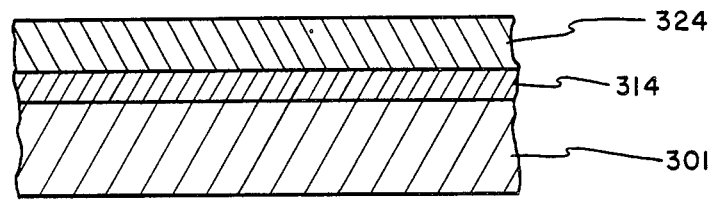
FIGS. 15–19 are cross sectional views illustrating the successive steps in the method for manufacturing the semiconductor integrated circuit device according to the second preferred embodiment.

Now, a method for manufacturing the semiconductor integrated circuit device according to the second preferred embodiment of the present invention will be described with reference to FIGS. 15 through 19. As shown in FIG. 15, a first semiconductor layer 314 of N+-type has a low resistance with a specific resistance of 0.01 Ω·cm and a thickness of 0.5 μm. Layer 114 is epitaxially grown on a high-resistance N-type silicon crystal substrate 301 having a specific resistance of 20 Ω·cm. Further, a P-type semiconductor layer 324 has a specific resistance of 2 Ω·cm and a thickness of 2 μm. Layer 324 is epitaxially grown on the first semiconductor layer 314.

Figure 16:
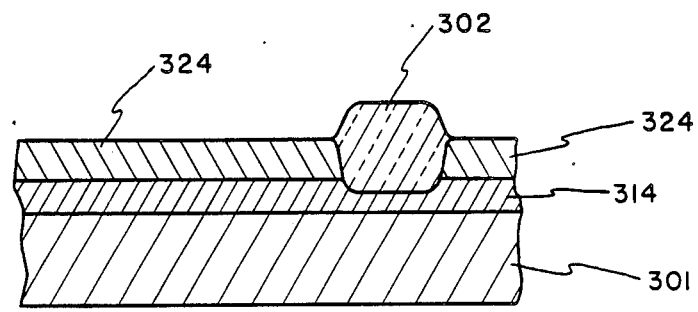
Figure 17:
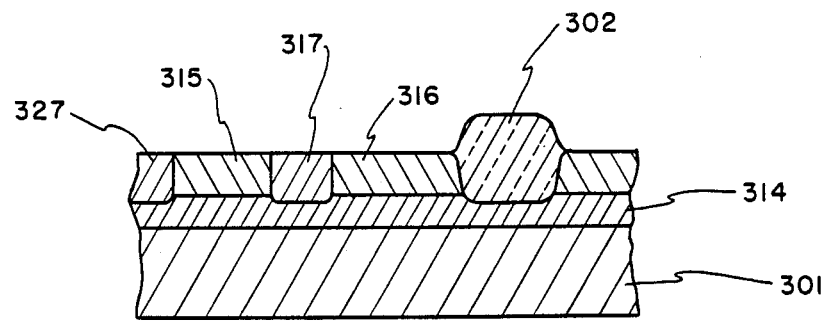

Subsequently, as shown in FIG. 16, a field insulating film 302 of silicon oxide (serving as a device isolation region) is formed in the P-type semiconductor layer 324 so as to reach the first semiconductor layer 314, film 302 being formed by making use of the known technique of selective oxidation. Then, as shown in FIG. 17, a first N-type region 317 is formed to pass through P-type layer 324 and into the first semiconductor layer 314 through a use of an ion implantation or a thermal oxidation after a mask (not shown) has been provided by the conventional photo-resist technique. The N-type region 317 divides the P-type semiconductor layer 324 into a first P-type region 315 and a second P-type region 316.

Figure 18:
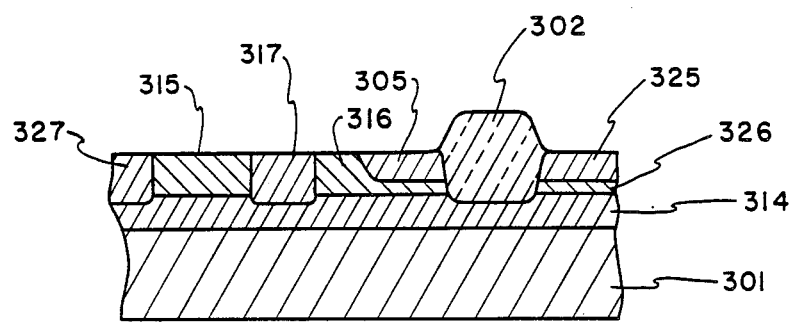
Figure 19:
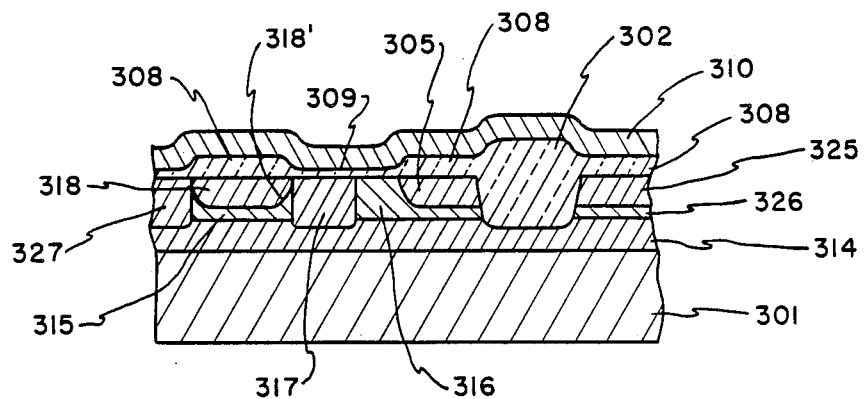

Thereafter, as shown in FIG. 18, a second N-type region 305 is provided within the second P-type region 316, and further, as shown in FIG. 19, a diffused wiring 318, a low resistance P-type portion 318', an insulating layer 308, a gate insulating film 309 and a first wiring layer 310 are provided. Subsequently, an inter-layer insulator layer 311 (FIG. 14) and a second wiring layer 312 are formed. Then, a basic structure of a two-device memory cell, as illustrated in FIGS. 13 and 14 and described above, can be obtained.

Now, a description will be made of a third preferred embodiment of the present invention. A semiconductor integrated circuit device, according to the third preferred embodiment of the present invention, is partly illustrated in plan in FIG. 20, and a cross sectional view (FIG. 21) thereof taken along line D-D' in FIG. 20, as viewed in the direction of the arrows is shown in FIG. 21.

Figure 20:
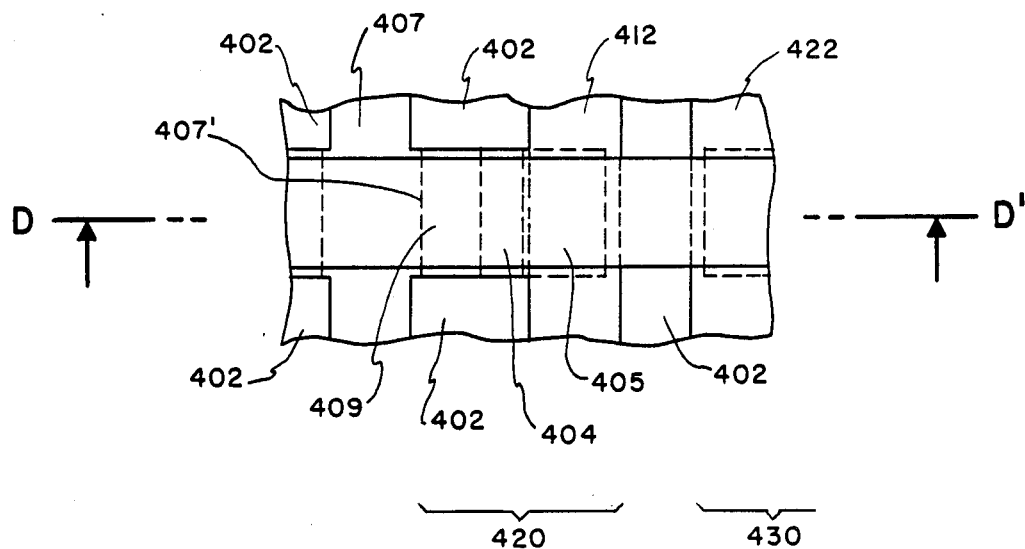
FIG. 20 is a partial plan view of a third preferred embodiment of the semiconductor integrated circuit device according to the present invention.
Figure 21:
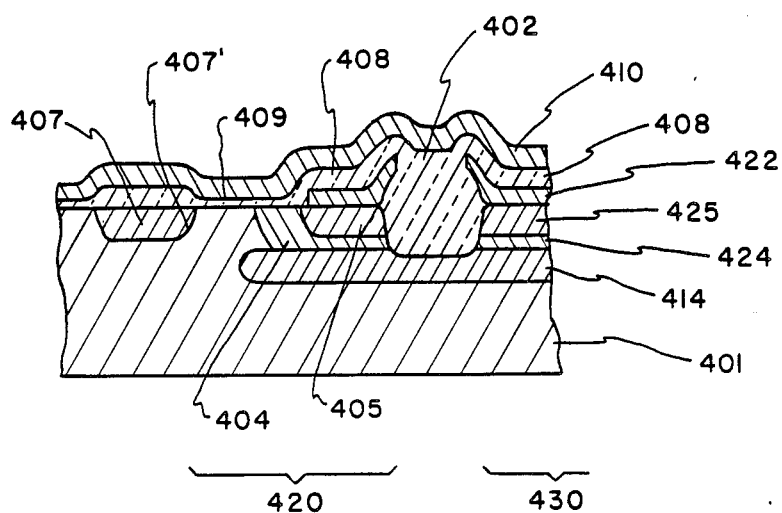
FIG. 21 is a cross sectional view of the semiconductor integrated circuit device shown in FIG. 20, taken along line D-D' in FIG. 20, as viewed in the direction of the arrows.

In FIGS. 20 and 21, a buried layer 414 of N+-type has a low resistivity of 0.01 Ω·cm and a thickness of approximately 1 μm. Buried layer 414 is formed within an N-type semiconductor substrate 401 having a specific resistivity of 2 Ω. cm; layer 414 is used instead of the N+-type first semiconductor layer 214 of the first embodiment. A diffused wiring layer 407 serves as a write bit line in a memory matrix and is formed in a surface portion of the N-type semiconductor substrate 401. A first P-type region 407' that is a continuous part of the diffused wiring 407 and a second P-type region 404 are provided in each memory cell region. Within the second P-type region 404 is provided an N-type region 405. This second P-type region 404 is formed in the surface portion of the N-type semiconductor substrate 401 with its bottom making contact with the buried layer 414 and with its side edges in contact with a field insulating film 402.

On the right side (as viewed in FIG. 21) of the field insulating film 402 to which the memory cell 420 in question contact, is positioned a second P-type region 424 of an adjacent memory cell 430, with its side edges in contact with the field insulating film 402. Further, within the P-type region 424 is provided an N-type region 425. Still further, a first wiring layer 412 (FIG. 20) is provided over the N-type region 405 and the field insulating film 402. The first wiring layer 412 consists of N-type polycrystalline silicon. The N-type region 405 is formed by impurity diffusion from the first wiring layer 412.

An insulating layer 408 is provided on the first wiring layer 412 and the field insulating film 402. A gate insulating film 409 is provided on a portion of the semiconductor substrate 401 between the first P-type region 407' and the second P-type region 404. A second wiring layer 410, which consists of polycrystalline silicon, is provided to form a gate electrode on the gate insulating film 409 and layer 410 also extends over the insulating film 408. The first wiring layer 412 is connected to the N-type region 405, at almost the entire surface of the N-type region 405. The reference number 422 identifies another first wiring corresponding to the wiring 412 for another memory cell 430.

Now, a fourth preferred embodiment of the present invention will be described. In this embodiment, the second transistor $T_2$ (FIG. 1) has a large read out signal current and a large threshold voltage difference.

According to this fourth embodiment, in the two-device memory cell shown in FIGS. 6 and 7, there is a lower impurity concentration at the portion of the second P-type region 204 which is just under the gate 209. There is a higher impurity concentration in the interior of the second P-type region 204 which determines the increment of the threshold voltage. As termed herein, the "impurity concentration" means a difference between an acceptor concentration and a donor concentration, rather than the concentration of the total number of impurity atoms.

According to this embodiment, after the second P-type region 204 has been formed, impurity atoms in the portion just under the gate region 209 are selectively removed. More particularly, boron is used as a P-type impurity. After the second P-type region 204 has been provided, the gate insulating film 209 is formed by thermally oxidizing surface of the second P-type region 204. During this thermal oxidation, boron atoms, in the neighborhood of the surface within the second P-type region 204, are sucked out into the oxide film. It is to be noted that besides the method employed in this embodiment, the P-type impurity concentration in the neighborhood of the surface can also be reduced by outwardly diffusing impurity atoms through a use of a high temperature heat treatment or by ion implantation of an impurity of the opposite conductivity type into the second P-type region, just under the gate 209.

Figure 22:
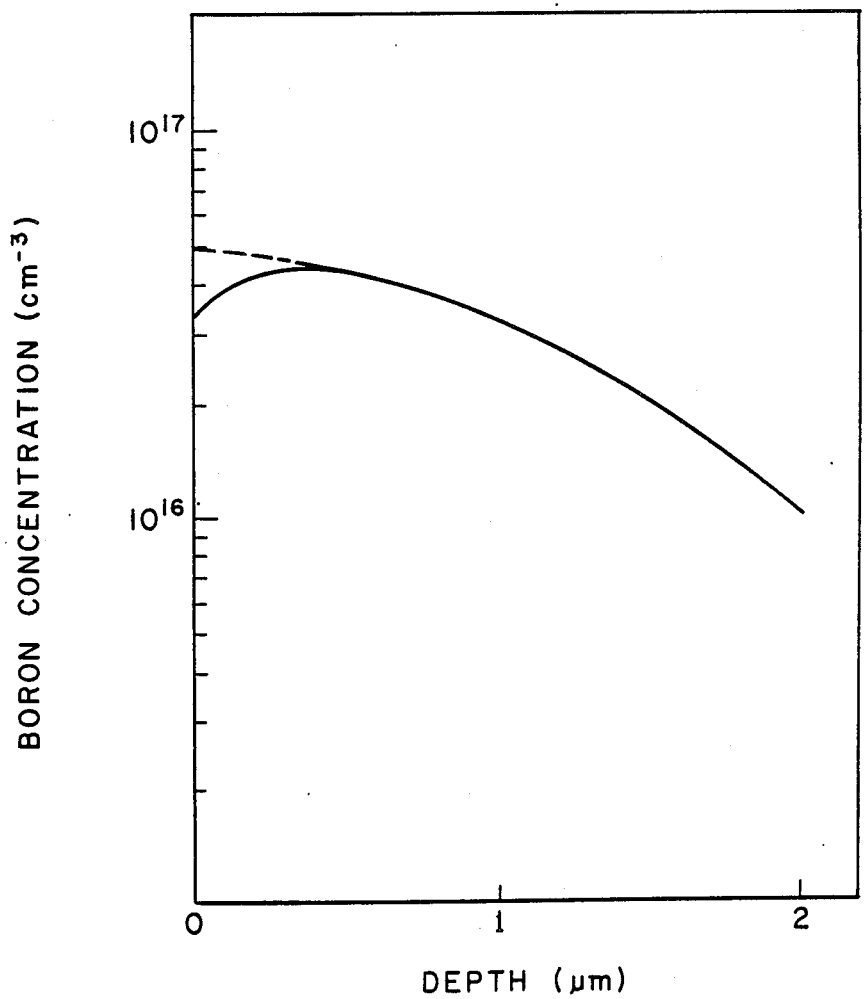
FIG. 22 is a graph showing one example of a concentration profile along a depth direction of boron atoms forming a P-well in the case where the region of the opposite conductivity type forming the substrate of the second transistor in the two-device memory cell, according to the present invention, is formed as a P-well.

FIG. 22 shows a boron atom concentration profile, forming the second P-type region 204 taken along the direction of depth. A dash line represents a profile immediately after boron was implanted and then a heat treatment has been carried out at 1140° C. for four hours. A solid line represents a profile just after a gate oxide film of 400 Å thickness has been grown. In this example, the boron concentration at the surface has been reduced by approximately 30%. The peak concentration is present at a depth of approximately 0.3 to 0.4 μm from the surface. Representing the potential at the second P-type region 204 by $V_{SUB}$, the potential $V_{SUB}=0$ V for the "0"-state, and the potential $V_{SUB}=2$ V for the "1"-state, the threshold voltages are obtained as a result of calculations on the basis of the impurity profiles shown in FIGS. 22 and as indicated in Table 1 below. In this Table, $V_{TH}(1)$ represents a threshold voltage of the second transistor in the "1"-state. The notation $V_{TH}(0)$ represents a threshold voltage or the second transistor in the "0"-state. The row (a) corresponds to the concentration profile represented by the dash line in FIG. 22. The row (b) corresponds to the concentration profile represented by the solid line in FIG. 22. The row (c) corresponds to the case where the boron suck out phenomenon is not utilized, but where the amount of boron implanted ions is reduced so that the $V_{TH}(1)$ may become equal to the $V_{TH}(1)$ in the row (b).

TABLE 1

|   | $V_{TH}(0)$ | $V_{TH}(1)$ |
|---|---|---|
| (a) | 1.0 V | 2.2 V |
| (b) | 0.8 V | 2.0 V |
| (c) | 0.8 V | 1.8 V |

Assuming that +2 V is used as a word line voltage, upon reading, then in the case of (c), a read current would flow even when the "0"-state has been written. In addition, the read current is proportional to a square of a difference between a word line voltage and the $V_{TH}(1)$ in the case where the second transistor T2 operates in its saturated range. Thus, in the case of (b), approximately 45% larger read current can be obtained than in the case of (a). Also, if the threshold voltage difference is large and the threshold voltage $V_{TH}(1)$ is low, the desired structure can be realized by ion-implanting an impurity into the second P-type region 204, just under the gate of the second transistor T2, as described previously. For example, by ion-implanting arsenic or phosphorous atoms into the second P-type region 204 just under the gate of the second transistor T2, the characteristics are as indicated in the row (a) of Table 1. At a rate of $0.2/C_{ox}$ per unit area, characteristics substantially equal to those indicated in the row (b) of Table 1. As the N-type impurity atoms to be ion-implanted, lithium, antimony, etc. can be used besides arsenic and phosphorous.

As described in detail above, according to the present invention, a two-device memory cell which is small-sized and excellent in stability (as compared to the known two-device memory cells, in the prior art) can be obtained, and, a small sized high-density semiconductor integrated circuit device can be realized.

While, the first transistor was formed by a P-channel type and the second transistor was formed by an N-channel type in the above-described preferred embodiments, the respective transistors could be of the opposite channel type. In that case, as a matter of course, the conductivity types of the respective regions and the polarities of the voltages applied thereto are all opposite to those employed in the above-described embodiments. In addition, if gallium arsenide, for example, is used as the semiconductor, tellurium, silicon, germanium, tin, selenium, ect. can be employed as the N-type impurity, and cadmium, lithium, zinc, etc. can be employed as the P-type impurity.

Those who are skilled in the art will readily perceive how to modify the invention. Therefore, the appended claims are to be construed to cover all equivalent structures which fall within the true scope and spirit of the invention.

We claim:

1. A semiconductor memory device of the type having a first field effect transistor of a first channel conductivity type and a second field effect transistor of a second channel conductivity type, said first transistor being adapted to supply a substrate region of said second transistor with one of first and second potentials thereby changing a threshold voltage of said second transistor, said semiconductor memory device comprising a semiconductor substrate of one conductivity type, a first semiconductor region of one conductivity type in said semiconductor substrate, a second semiconductor region of the opposite conductivity type formed in said first semiconductor region, a third semiconductor region of the opposite conductivity type formed in contact with said first semiconductor region, a fourth semiconductor region of said one conductivity type formed in said third semiconductor region, a fifth semiconductor region of said one conductivity type formed within said semiconductor substrate having an impurity concentration which is higher than an impurity concentration of said first semiconductor region, said fifth region extending under said third semiconductor region, and making contact with the bottom surface of said third semiconductor region to form a PN junction therewith, said PN junction providing a capacitance between said third and fifth semiconductor regions, a gate insulating layer formed on said first and third semiconductor regions, and a conductive layer formed on said gate insulating layer, wherein said second and third semiconductor regions serving as a drain and a source of said first transistor, said first region and a first part of said conductive layer above the surface of said first region serve as a substrate region and a gate of said first transistor, respectively, said first and fourth semiconductor regions serving as a drain and a source of said second transistor, respectively said third semiconductor region and a second part of said conductive layer above the surface of said third semiconductor region serving as a substrate region and a gate, respectively, of said second transistor, respectively.

2. A semiconductor integrated circuit device of a type having a first insulated-gate field effect transistor of a first channel conductivity type, a second insulated-gate field effect transistor of a second channel conductivity type, a source-drain path of said first transistor being connected to a substrate region of said second transistor and a data line, gates of said first and second transistors being connected to a common gate line, the device comprising a semiconductor substrate of one conductivity type, a first semiconductor layer of said one conductivity type having a resistivity which is lower than the resistivity of said substrate, said first layer being formed on said semiconductor substrate, a second semiconductor layer of said one conductivity type and having a resistivity which is higher than the resistivity of said first layer, said second layer being formed on said first semiconductor layer, a first region of the opposite conductivity type formed in said second semiconductor layer along the major surface thereof, a second region of said opposite conductvity type formed in said second semiconductor layer and extendng inwardly from a major surface thereof to reach said first semiconductor layer to provide a PN junction with a capacitance therebetween, an insulating layer formed on a surface of said second layer at least between said first region and said third region, a gate wiring layer formed on said insulating layer, a third region of said one conductivity type formed in said second region along a major surface of said second region, a gate insulating film formed on the surface of a portion of said second semiconductor layer and a portion of said second region between said first region and said third region, and a gate electrode positioned over said gate insulating film, said first region being employed as either a source or a drain region of said first transistor, said portion of said second semiconductor layer being employed as a channel region of said first transistor and either a source or a drain region of said second transistor, said portion of said second region being employed as a channel region of said second transistor and the other of said source or drain regions of said first transistor, second regions and a portion of said third region being employed as the other of said source or drain regions of said second transistor.

3. A semiconductor integrated circuit device according to claim 2, in which the impurity concentration in said second region takes a maximum value at a depth of 0.3 $\mu$m to 0.4 $\mu$m from the surface of said second region.

4. A semiconductor integrated circuit device according to claim 2, in which the ratio of a capacitance $C_{ST}$ formed around said second region as compared to a capacitance $C_A$ formed between said gate electrode and said second region via said gate insulating film is less than 0.14.

5. A semiconductor integrated circuit device comprising a plurality of memory cells each having first and second insulated gate field effect transistor, gates of said first and second transistors being connected to a word line, said first transistor being adapted to selectively apply first and second potentials to a substrate region of said second transistor to change the threshold voltage of said second transistor between different values, said device comprising a semiconductor substrate of one conductivity type, a first semiconductor layer of said one conductivity type having a resistivity which is lower than the resisitivity of said semiconductor substrate, said first layer being formed on said semiconductor substrate, a second semiconductor layer of the opposite conductivity type formed on said first semiconductor layer, a first region of said one conductivity type formed in said second semiconductor layer to extend inwardly from a major surface thereof and to reach said first semiconductor layer while dividing said second semiconductor layer into second and third regions of said opposite conductivity type, a fourth region of said one conductivity type provided within said third region along a major surface thereof, a fifth region of said opposite conductivity type and formed within said second region and along a major surface thereof, a gate insulating film formed on the surface of a portion of said third region, and a gate electrode formed over said gate insulating film, said first transistor using said second region and a portion of said third region as a source region and a drain region, respectively, and a surface of said first region as a channel region, and said second transistor using said first region and said fourth region as source region and a drain region respectively, and a surface of said third region as a channel region.

6. A semiconductor integrated circuit device according to claim 5, in which a field insulated film is formed in said second semiconductor layer so as to make contact with said first semiconductor layer and with said third region.

7. A semiconductor integrated circuit device according to claim 5, in which the impurity concentration in said third region takes a maximum value at a depth of 0.3 $\mu$m to 0.4 $\mu$m from the major surface of said semiconductor device.

8. A semiconductor integrated circuit device according to claim 5, in which the ratio of a capacitance $C_{ST}$ formed around said third region and a capacitance $C_A$ formed between said gate electrode and said third region via said gate insulating film satisfy a relationship of $C_A/C_{ST}<0.14$.

9. A semiconductor integrated circuit device of the type having a first field effect transistor of a first channel conductivity type, a second field effect transistor, a write bit line, a read bit line, and a word line, a source-drain path of said first transistor being connected between said write bit line and a substrate region of said second transistor, one of a drain and a source of said second transistor being connected to said read bit line, gates of said first and second transistors being commonly connected to said word line, the device comprising a semiconductor base body including a semiconductor substrate of one conductivity type, a first semiconductor layer of said one conductivity type having a lower resistance than said semiconductor substrate and formed on said semiconductor substrate and a second semiconductor layer of said one conductivity type formed on said first semiconductor layer a plurality of memory cell regions defined on a surface of said semiconductor base body, each of said memory cell regions being isolated from other said memory cell regions by a field insulating film buried in said semiconductor base body as extending from the surface of said second semiconductor layer down to said first semiconductor layer, each of said memory cell regions including, a first region of the opposite conductivity type formed along a surface of said second semiconductor layer, a second region of said opposite conductivity type formed in said second semiconductor layer within each of said memory cell regions and separated from said first region, a bottom portion of said second region making contact with said first semiconductor layer without substantially entering within said first semiconductor layer, a side wall portion of said second region making contact with said field insulating film, a third region of said one conductivity type formed within said second region, a first insulating layer formed on said impurity region of said one conductivity type, a surface portion of said second semiconductor layer being positioned between said first and second regions, a first gate insulating film formed on said surface portion of said second semiconductor layer, a second gate insulating film formed on a surface of said second region between said surface portion of said second semiconductor layer and said impurity region of said one conductivity type, a second insulating layer formed on said first region, a first wiring layer extending over said first and second insulating layers, over said first and second gate insulating films and over said first insulating film substantially at right angles to said one direction, and a second wiring layer connected to said impurity region and extending in said one direction on said field insulating film, said first region serving as said write bit line, said second wiring layer serving as said read bit line, said first wiring serving as said word line, a portion of said first region being located within said memory device region serving as either a source or a drain region of said first transistor, the portion of said second semiconductor layer between said first and second regions serving as either a source or a drain region of said second transistor, a surface portion of said second semiconductor layer serving as a channel region of said first transistor, said second region serving as the other of the source and drain regions of said first transistor, a surface portion of said second region serving as a channel region of said second transistor, said impurity region serving as the other of the source and drain regions of said second transistor, and the portion of said first wiring layer on said first and second gate insulating films serving as gate electrodes of said first and second transistors, respectively.

10. A semiconductor integrated circuit device comprising a semiconductor substrate of one conductivity type, a first semiconductor layer of said one conductivity type having a lower resistance than said semiconductor substrate, said first layer being formed on said semiconductor substrate, a second semiconductor layer of the opposite conductivity type formed on said first semiconductor layer, a field insulating film buried in said second semiconductor layer and extending from the surface of said second semiconductor layer down to said first semiconductor layer, a first region of said one conductivity type formed in said second semiconductor layer and extending inwardly from a major surface thereof to reach said first semiconductor layer while dividing said second semiconductor layer into second and third regions of said opposite conductivity type, a fourth region of said one conductivity type formed within said third region and along a major surface thereof, a fifth region of said opposite conductivity type formed within said second region and along a major surface thereof, a first insulating layer formed on said fourth and fifth regions, a first gate insulating film formed on said surface portion of said first region, a second gate insulating film formed on the surface of said third region between said surface portion of said first region and said fourth region, a first wiring layer extending over said first insulating layer, said first wiring layer extending over said first and second gate insulating films and over said field insulating film substantially at right angles to said one direction, a second insulating layer formed on said first wiring layer, a second wiring layer connected to said fourth region and extending over said second insulating layer and on said field insulating film in said one direction, said first region serving as a channel region of a first field effect transistor, said third region serving as a channel region of a second field effect transistor, and means electrically connected to said fifth region for selectively applying first and second potentials to said third region to change the threshold voltage of said second transistor between two different values.

11. A semiconductor memory cell of the type having first and second field effect transistors, the gates of said first and second transistors being connected to a word line, said first transistor being adapted to selectively apply first and second potentials to a substrate of said second transistor to change the threshold voltage of said second transistor during a write period, said memory cell comprising a semiconductor substrate of one conductivity type, a buried layer of said one conductivity type having an impurity concentration which is higher than the impurity concentration of said semiconductor substrate and being formed within said semiconductor substrate, a first region of the opposite conductivity type formed in said semiconductor substrate along a major surface thereof, a second region of said opposite conductivity type formed in said semiconductor substrate and extending inwardly from the major surface thereof to reach said buried layer, a third region of said one conductivity type formed in said second region from the major surface thereof, a first wiring layer connected to said third region, a gate insulating film formed on the surface of a portion of said semiconductor substrate and a portion of said second region between said first region and said third region, an inter-layer insulating film formed on the surface of said first wiring layer, a gate electrode formed on said gate insulating film and said inter-layer insulating film, said first region being employed as either a source or a drain region of a first insulating gate field effect transistor, said portion of said semiconductor substrate being employed as a channel region of said first transistor and as either a source or a drain region of a second insulating gate field effect transistor, said portion of said second region being employed as a channel region of said second transistor and as the other of the source or drain regions of said first transistor, and said third region being employed as the other of the source or drain regions of said second transistor.

12. A semiconductor integrated circuit device as claimed in claim 11, further comprising a field insulating film buried in said semiconductor substrate and extending inwardly from the major surface thereof to reach said buried layer and making contact with said second and third regions.

13. A semiconductor integrated circuit device as claimed in claim 11 wherein, said first wiring layer consists of said one conductivity polycrystalline silicon.

* * * * *